(12) United States Patent
McBrien et al.

(10) Patent No.: US 9,482,103 B2
(45) Date of Patent: Nov. 1, 2016

(54) INTERMEDIATE ADDITIVELY MANUFACTURED COMPONENT

(71) Applicant: United Technologies Corporation, Farmington, CT (US)

(72) Inventors: John McBrien, South Glastonbury, CT (US); Lea Kennard Castle, Vernon, CT (US); Brandon W. Spangler, Vernon, CT (US); JinQuan Xu, East Greenwich, RI (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 15/167,162

(22) Filed: May 27, 2016

(65) Prior Publication Data

US 2016/0273369 A1 Sep. 22, 2016

Related U.S. Application Data

(62) Division of application No. 14/784,857, filed as application No. PCT/US2014/034455 on Apr. 17, 2014, now Pat. No. 9,375,782.

(60) Provisional application No. 61/813,871, filed on Apr. 19, 2013.

(51) Int. Cl.
*B22C 9/02* (2006.01)
*F01D 5/18* (2006.01)
(Continued)

(52) U.S. Cl.
CPC ............... *F01D 5/282* (2013.01); *B22C 9/061* (2013.01); *B22C 9/101* (2013.01); *B22C 9/108* (2013.01);
(Continued)

(58) Field of Classification Search
CPC ............. B22C 7/02; B22C 9/02; B22C 9/04; B22C 9/043; B22C 23/06
USPC .................... 164/9, 24, 34, 35, 80, 516–529
See application file for complete search history.

(56) References Cited

U.S. PATENT DOCUMENTS 4,574,451 A * 3/1986 Smashey ................. B23P 15/04
164/132
5,296,308 A  3/1994 Caccavale et al.
(Continued)

FOREIGN PATENT DOCUMENTS

EP  2052693 A1  4/2009

OTHER PUBLICATIONS

International Search Report and Written Opinion from PCT Application Serial No. PCT/US2014/034455, dated Jan. 8, 2015, 13 pages.

(Continued)

*Primary Examiner* — Kevin E Yoon
(74) *Attorney, Agent, or Firm* — Kinney & Lange, P.A.

(57) ABSTRACT

An intermediate component with an internal passageway includes a solid metallic additively manufactured component with an internal passageway in a near finished shape. The component has voids greater than 0 percent but less than approximately 15 percent by volume and up to 15 percent additional material by volume in the near finished shape compared to a desired finished configuration. Also included are a ceramic core disposed within the internal passageway of the component and an outer ceramic shell mold encasing an entirety of the component, such that an entire external surface of the component is covered by the outer ceramic shell mold.

19 Claims, 2 Drawing Sheets

(51) Int. Cl.
*F01D 5/28* (2006.01)
*B22C 9/10* (2006.01)
*B22C 9/06* (2006.01)
*B22D 25/02* (2006.01)
*B22D 27/04* (2006.01)
*B22D 23/06* (2006.01)
*B22F 3/105* (2006.01)
*B22F 3/11* (2006.01)
*B22F 3/24* (2006.01)
*B23K 15/00* (2006.01)
*F23R 3/28* (2006.01)
*F01D 5/14* (2006.01)
*F01D 9/02* (2006.01)
*B33Y 10/00* (2015.01)
*B33Y 80/00* (2015.01)

(52) U.S. Cl.
CPC .............. *B22D 23/06* (2013.01); *B22D 25/02* (2013.01); *B22D 27/04* (2013.01); *B22F 3/1055* (2013.01); *B22F 3/11* (2013.01); *B22F 3/24* (2013.01); *B23K 15/0086* (2013.01); *B23K 26/342* (2015.10); *F01D 5/147* (2013.01); *F01D 9/02* (2013.01); *F23R 3/28* (2013.01); *B22F 2003/248* (2013.01); *B22F 2998/10* (2013.01); *B33Y 10/00* (2014.12); *B33Y 80/00* (2014.12); *F05D 2230/31* (2013.01); *F05D 2300/175* (2013.01); *F05D 2300/211* (2013.01)

(56) References Cited

U.S. PATENT DOCUMENTS

| | | |
|---|---|---|
| 5,868,194 A | 2/1999 | Horwood |
| 6,270,710 B1 | 8/2001 | Bartel et al. |
| 6,766,850 B2 | 7/2004 | Gegel et al. |
| 7,032,642 B2 * | 4/2006 | Bhangu .................. B22C 7/02 164/361 |
| 7,413,001 B2 | 8/2008 | Wang et al. |
| 7,461,684 B2 | 12/2008 | Liu et al. |
| 8,327,911 B2 | 12/2012 | Kush et al. |
| 2003/0062145 A1 | 4/2003 | Frasier et al. |
| 2004/0211547 A1 | 10/2004 | Gegel et al. |
| 2005/0040147 A1 | 2/2005 | Hoebel et al. |
| 2005/0205232 A1 | 9/2005 | Wang et al. |
| 2010/0025001 A1 | 2/2010 | Lee et al. |
| 2013/0004680 A1 | 1/2013 | Godfrey et al. |
| 2013/0071562 A1 | 3/2013 | Szuromi et al. |
| 2016/0059302 A1 | 3/2016 | McBrien et al. |

OTHER PUBLICATIONS

Gasser, A., et al., "Laser Additive Manufacturing, Laser Metal Deposition (LMD) and Selective Laser Melting (SLM) in Turbo-Engine Applications", from Laser Material Processing, Apr. 2010, pp. 58-63.

EPO Examination Report, for European Patent Application No. 14164970.7, dated Jul. 8, 2016, 5 pages.

* cited by examiner

INTERMEDIATE ADDITIVELY MANUFACTURED COMPONENT

CROSS-REFERENCE TO RELATED APPLICATION(S)

This application is a divisional of U.S. application Ser. No. 14/784,857, filed Oct. 15, 2015 entitled "Regenerating An Additively Manufactured Component", which is a §371 National Stage of PCT Application No. PCT/US2014/34455, entitled "Regenerating An Additively Manufactured Component", filed Apr. 17, 2014, which claims priority to U.S. provisional application Ser. No. 61/813,871, filed on Apr. 19, 2013, and entitled "Method For Forming Single Crystal Parts Using Additive Manufacturing And Remelt," the disclosure of which is incorporated by reference herein in its entirety.

BACKGROUND

The present embodiments relate generally to the field of additive manufacturing and, more particularly, to curing defects in an additively manufactured component.

Additive manufacturing is a process by which parts can be made in a layer-by-layer fashion by machines that create each layer according to a three dimensional (3D) computer model of the part. In powder bed additive manufacturing, a layer of powder is spread on a platform and selective areas are joined by sintering or melting by a directed energy beam. The platform is indexed down, another layer of powder is applied, and selected areas are again joined. The process is repeated until a finished 3D part is produced. In direct deposit additive manufacturing technology, small amounts of molten or semi-solid material are applied to a platform according to a 3D model of a part by extrusion, injection, or wire feed and energized by an energy beam to bond the material to form a part. Common additive manufacturing processes include selective laser sintering, direct laser melting, direct metal laser sintering (DMLS), electron beam melting, laser powder deposition, electron beam wire deposition, etc.

Because a part is produced in a continuous process in an additive manufacturing operation, features associated with conventional manufacturing processes such as machining, forging, welding, casting, etc. can be eliminated leading to savings in cost, material, and time. Furthermore, additive manufacturing allows components with complex geometries to be built relatively easily, compared to conventional manufacturing processes.

However, one challenge associated with additive manufacturing is quality control of the component being additively built. Generally, component subsurface defects are inherent in additive manufacturing processes. It can take tens of hours (or more) to additively build a component, yet it is inevitable that at least some finished additively built components will have subsurface defects, such as contaminates and voids. As a result, such defective components are rejected after spending significant resources in building these components.

SUMMARY

One embodiment includes a method to regenerate a component. The method includes additively manufacturing a component to have voids greater than 0 percent but less than approximately 15 percent by volume in a near finished shape. The component is encased in a shell mold. The shell mold is cured. The encased component is placed in a furnace and the component is melted. The component is solidified in the shell mold. The shell mold is removed from the solidified component.

Another embodiment includes a method to regenerate a component with internal passageways. The method includes additively manufacturing the component to have voids greater than 0 percent but less than approximately 15 percent by volume with an internal passageway in a near finished shape. The internal passageway is filled with a slurry. The slurry is cured to form a core. The component is encased in a shell mold. The shell mold is cured. The encased component is placed in a furnace and the component is melted. The component is solidified in the shell mold. The shell mold and core are removed from the solidified component.

A further embodiment includes an intermediate component with an internal passageway. The intermediate component includes a solid metallic additively manufactured component with an internal passageway in a near finished shape. The component has voids greater than 0 percent but less than approximately 15 percent by volume and up to 15 percent additional material by volume in the near finished shape compared to a desired finished configuration. Also included are a ceramic core disposed within the internal passageway of the component and an outer ceramic shell mold encasing an entirety of the component, such that an entire external surface of the component is covered by the outer ceramic shell mold.

Figure 1:
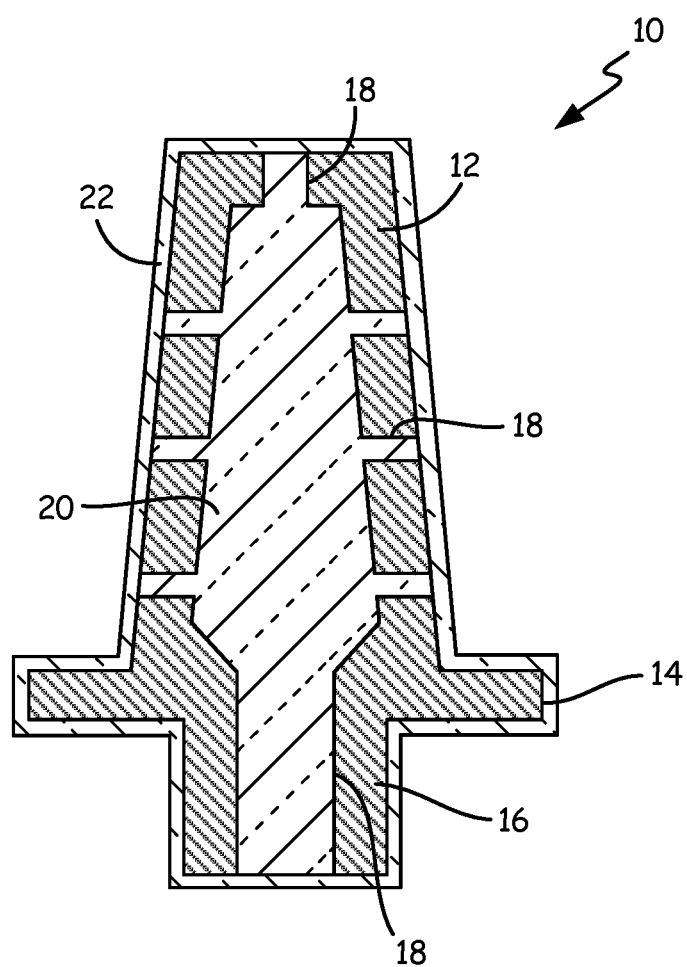
FIG. 1 is a cross-sectional view of an intermediate component, with internal passageways, having a core and a shell mold.

While the above-identified drawing figures set forth one or more embodiments of the invention, other embodiments are also contemplated. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

Generally, the present embodiments provide for manufacturing or regenerating an additively manufactured component with defects (e.g., subsurface defects) to cure the defects such that the component need not be rejected and can be used as intended. Defects in an additively manufactured component are cured by using the component as a pattern to create a shell mold, similar to a shell mold for a conventional investment casting process. The component can be completely encased in a shell mold, melted, and then solidified to produce a substantially defectless component of the same, potentially complex, shape. Other features and benefits will be recognized in view of the entirety of the present disclosure, including the accompanying figures.

FIG. 1 is a schematic, cross-sectional view of additively manufactured intermediate component 10. Intermediate component 10 can be a turbine blade which includes airfoil 12, platform 14, root 16, and internal passageways 18.

Intermediate component 10 as shown in FIG. 1 is just one example, provided by way of example and not limitation. Additively manufactured component 10 can be any component capable of being additively manufactured, which can include, for example, a fuel nozzle or turbine blade or vane. Included with intermediate component 10, and shown in FIG. 1, are inner core 20 and outer shell mold 22. In one example as shown in FIG. 1, core 20 is a ceramic core and shell mold 22 is a ceramic shell mold. Other core 20 and shell mold 22 materials are also contemplated.

Intermediate component 10 is additively manufactured in a near finished shape such that airfoil 12, platform 14, root 16, and internal passageways 18 are integral to component 10. However, ceramic core 20 and ceramic shell mold 22 are not formed as part of component 10 during an additive manufacturing process. Component 10 can be additively manufactured using any type of additive manufacturing process which utilizes layer-by-layer construction, including, but not limited to, selective laser sintering, selective laser melting, direct metal deposition, direct metal laser sintering (DMLS), direct metal laser melting, electron beam melting, electron beam wire melting, and others known in the art. Component 10 is additively manufactured to have up to 15 percent additional material by volume in the near finished shape (i.e., intermediate component 10 as shown in FIG. 1) as compared to a desired finished configuration of component 10 (i.e., component 10 after being regenerated to be substantially free of subsurface defects). Any additional material of component 10 can be located at any location where extra material can be machined. In one example, the extra material can be located at root 16 and/or a tip of airfoil 12. Moreover, component 10 can be additively manufactured to be of a metal, such as a nickel-based superalloy, cobalt-based superalloy, iron-based superalloy, and mixtures thereof.

Component 10, as a result of being additively manufactured, may have subsurface defects. Subsurface defects can include unwanted defects, such as contaminates and/or voids. Voids can include, for example, pores and/or cracks. For example, component 10 can have voids greater than 0 percent but less than approximately 15 percent by volume. Often, component 10 will have voids greater than 0 percent but less than approximately 1 percent by volume, and even in some instances less than approximately 0.1 percent by volume. Component 10 may be deemed unsuitable for use as intended when containing unwanted levels of voids, which in many applications can be fractions of a single percent by volume. For this reason, component 10 can be regenerated to cure subsurface defects.

As part of a process for regenerating component 10 to be substantially free of subsurface defects, component 10 has ceramic core 20 and ceramic shell mold 22 added to component 10 after component 10 is additively manufactured. In other embodiments, component 10 can have core 20 and shell mold 22 of materials other than ceramic. Ceramic core 20 is formed in internal passageways 18, such that ceramic core 20 substantially conforms to a shape of internal passageways 18. Ceramic core 20 can be formed by filling internal passageways 18 with a ceramic slurry, resulting in a volume of internal passageways 18 being occupied by the ceramic slurry. The ceramic slurry can be ceramics commonly used as core materials for investment casting, for example, silica, alumina, zircon, cobalt, mullite, kaolin, and mixtures thereof. Once internal passageways 18 are filled, or substantially filled, with the ceramic slurry, the ceramic slurry is cured to form ceramic core 20 (having generally solid and rigid properties). In an alternative embodiment, where a component has been additively manufactured and does not have an internal passageway 18, the component can be regenerated to substantially cure defects without the use of ceramic core 20.

Ceramic shell mold 22 is also added to component 10. Ceramic shell mold 22 can encase an entirety of component 10, such that an entire external surface of component 10 is covered by ceramic shell mold 22 and ceramic shell mold 22 substantially conforms to a shape of component 10. Intermediate component 10 serves as a pattern for making ceramic shell mold 22, because component 10 has a near finished shape. Ceramic shell mold 22 can be formed to encase component 10 by dipping the entirety of component 10 into a ceramic slurry to form a layer of a green (i.e. uncured) ceramic shell mold on the entirety of component 10. The layer is dried and the component is dipped and dried repeatedly for as many times as necessary to form the green ceramic shell mold with an acceptable thickness. A thickness of the green ceramic shell mold can range from approximately 5 mm to approximately 32 mm. The green ceramic shell mold is then cured to form ceramic shell mold 22 (having generally solid and rigid properties). The ceramic slurry, and thus ceramic shell mold 22, can be, for example, silica, alumina, zircon, cobalt, mullite, kaolin, and mixtures thereof. Alternatively, in one example, ceramic shell mold 22 and ceramic core 20 can be formed simultaneously such that ceramic shell mold 22 encases the entire external surface of component 10 and ceramic core 20 encases an entire surface of internal passageways 18.

Figure 2:
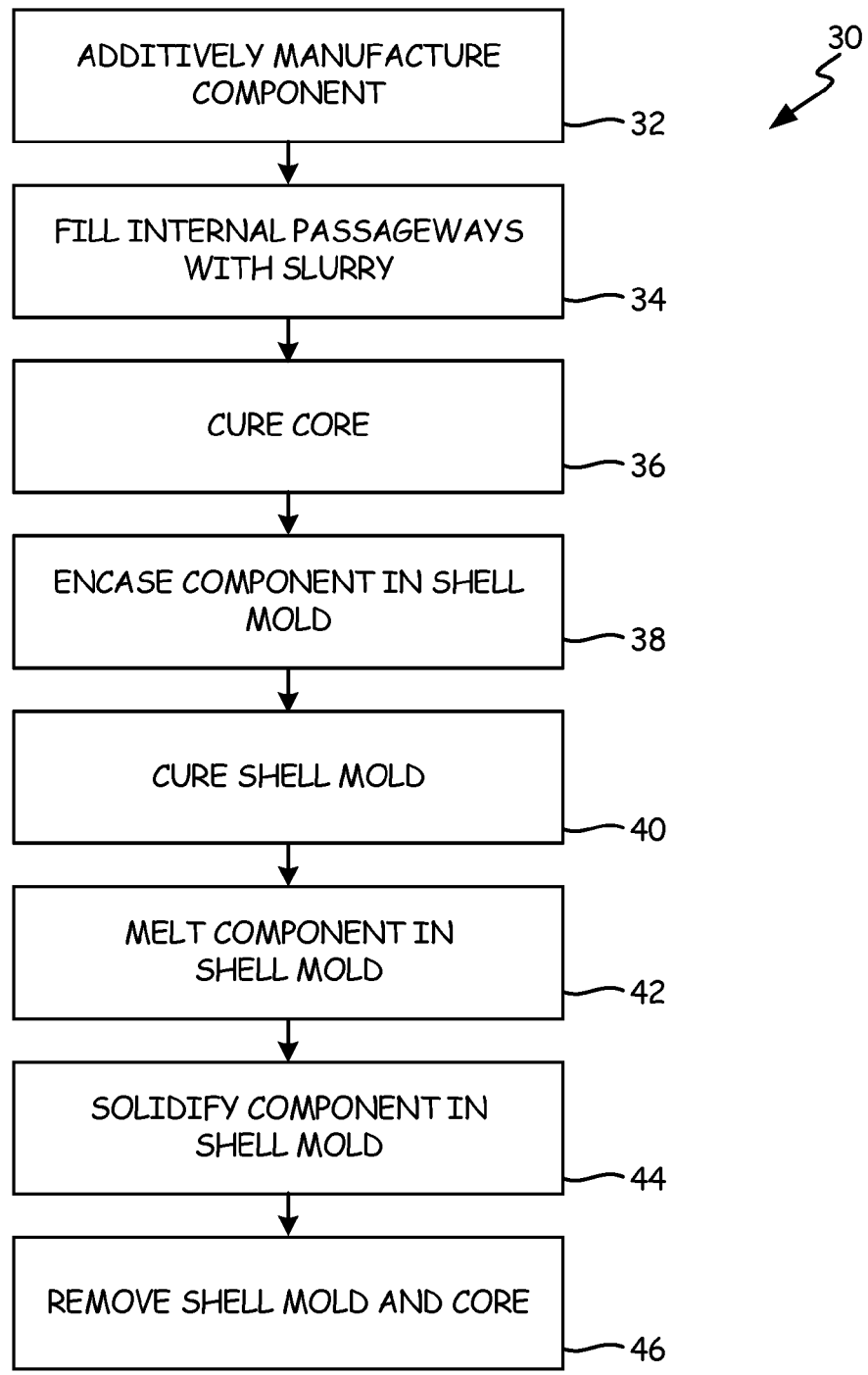
FIG. 2 is a flow chart illustrating a method to regenerate an additively manufactured component.

FIG. 2 is a flow chart illustrating an embodiment of additively manufactured component regeneration method 30. Method 30 can be used to cure component 10 of subsurface defects such that component 10 can be used as desired and need not be rejected.

First, intermediate component 10, which can optionally include internal passageway 18, is additively manufactured in a near finished shape (step 32). Any type of additive manufacturing process including, but not limited to, selective laser sintering, selective laser melting, direct metal deposition, direct metal laser sintering, direct metal laser melting, electron beam melting, electron beam wire melting, and others known in the art can be used to additively manufacture component 10. Moreover, component 10 can be additively manufactured to be of a metal, such as a nickel-based superalloy, cobalt-based superalloy, iron-based superalloy, and mixtures thereof. Additively manufactured component 10 has unwanted defects, which can include voids (e.g., pores and/or cracks) greater than 0 percent but less than approximately 15 percent by volume (other unwanted defects can include contamination). In one embodiment, component 10 has unwanted voids greater than 0 percent but less than approximately 1 percent by volume, and even less than approximately 0.1 percent by volume. Furthermore, component 10 can be additively manufactured to have up to 15 percent additional material by volume in the near finished shape compared to a desired finished configuration. This means that component 10 as additively built can include extra material beyond what is needed to form the desired finished configuration. This extra material can be located on component 10 at any location where extra material may be machined. In one example, the extra material can be located at root 16 and/or the tip of airfoil 12 such as at a discrete sprue location. In one embodiment, component 10 is intentionally additively manufactured to contain a hollow portion (e.g., a hollow portion resembling a pore of a desired size, shape, etc.) such that the additive manufacturing process is less time consuming.

Next, at least one internal passageway 18, if present, can be filled with a ceramic slurry or other suitable core material (step 34). Filling internal passageway 18 with the slurry results in a volume of internal passageway 18 being occupied by the slurry. Each internal passageway 18 can be filled with the slurry. The slurry can be of ceramic materials commonly used as core materials in conventional casting processes, including, but not limited to, silica, alumina, zircon, cobalt, mullite, and kaolin.

Once internal passageways 18 are filled with the ceramic slurry, the ceramic slurry is cured to form inner core 20 (step 36). The slurry can be cured in situ in component 10 by a suitable thermal process. Core 20 occupies internal passageways 18, such that core 20 substantially conforms to a shape of internal passageways 18 of component 10. Steps 34 and 36 can be omitted if no internal passageway 18 is present.

Then, component 10 is encased in a green (i.e. uncured) shell mold (step 38). The green shell mold can encase an entirety of component 10 (i.e. substantially seals component 10), such that an entire external surface of component 10 is covered by the green shell mold and the green shell mold substantially conforms to a shape of component 10. There can be instances where core 20 is at or near the external surface of component 10 and core 20 then forms a portion of shell mold 22, resulting in gaps in shell mold 22 over portions of core 20. The green shell mold can be formed to encase component 10 by dipping the entirety of component 10 into a ceramic slurry to form a layer of the green ceramic shell mold on the entirety of component 10. The layer is dried and the component is dipped and dried repeatedly for as many times as necessary to form the green shell mold with an acceptable thickness. As one alternative to dipping component 10 into the ceramic slurry, the ceramic slurry can be poured onto component 10 and dried. An acceptable thickness of the green shell mold can range from approximately 5 mm to approximately 32 mm. The green shell mold can be heated at an intermediate temperature to partially sinter the ceramic and burn off any binder material in the green shell mold.

The green shell mold is then cured to form outer shell mold 22 (step 40). The shell mold 22, can be, for example, silica, alumina, zircon, cobalt, mullite, kaolin, and mixtures thereof. Ceramic shell mold 22 can be cured at a temperature ranging between approximately 649° C. (1200° F.) to approximately 982° C. (1800° F.) for a time ranging between approximately 10 to approximately 120 minutes to cure ceramic shell mold 22 to full density. Because the green ceramic shell mold encased an entirety of component 10 and substantially conforms to a shape of component 10, component 10 serves as a pattern in ceramic shell mold 22 (in lieu of a wax pattern used in traditional investment casting processes).

Next, component 10 with unwanted defects is melted in ceramic shell mold 22, which now has the pattern of component 10 (step 42). One way of melting component 10 in ceramic shell mold 22 is to place at least part of component 10 in a furnace. However, other means of applying heat such that component 10 is melted in ceramic shell mold 22 can be used. For example, a dual chill block and furnace assembly can be used. The material from which component 10 is made generally has a melting point lower than a melting point of the material from which core 20 and shell mold 22 are formed. This can allow component 10 to melt inside ceramic shell mold 20 without contaminating component 10 material with ceramic core 20 and/or ceramic shell mold 22 material. Melting component 10 in ceramic shell mold 22 allows component 10 material to densify, with assistance of gravity or other means, and substantially eliminate the unwanted voids originally present in component 10. If component 10 was additively manufactured to have up to 15 percent additional material by volume, this additional material also melts and fills into pores and/or cracks in component 10 (such that the additional material that fills into pores and/or cracks in component 10 is no longer present where originally located). Melting component 10 in shell mold 22 can also help to rid component 10 of contaminates, which are generally more soluble in component 10 liquid phase than component 10 solid phase.

After component 10 has melted inside ceramic shell mold 22, component 10 is solidified in ceramic shell mold 22 (step 44). Component 10 can be solidified using a chill block, or any other means of cooling component 10 to a temperature at which component 10 can solidify. Solidifying component 10 in ceramic shell mold 22 forms component 10 to be of the same shape that component 10 was originally additively manufactured as, but now component 10 has densified and reduced or even substantially eliminated voids or other defects (i.e. to a desired finished configuration). If component 10 is directionally solidified using a starter seed or grain selector, contaminates in component 10 will be pushed, or collected, by the solidification interface into a common area of component 10 which can then be removed and scrapped.

Finally, ceramic core 20 and ceramic shell mold 22 are removed from solidified component 10 (step 46). For example, ceramic core 20 can be etched out or removed by caustic leaching and ceramic shell mold 22 can be knocked out. Finished component 10 can also be inspected to ensure unwanted defects, such as voids, have been reduced or substantially eliminated and finished component 10 has the same shape as additively manufactured component 10. Method 30 can then be repeated if needed.

Where a component has been additively manufactured and does not have an internal passageway 18, the component can be regenerated to substantially cure subsurface defects similar to that described for method 30. However, because there is no internal passageway 18, steps 34 and 36 need not be performed.

Discussion of Possible Embodiments

The following are non-exclusive descriptions of possible embodiments of the present invention.

A method to regenerate a component, the method comprising additively manufacturing a component to have voids greater than 0 percent but less than approximately 15 percent by volume in a near finished shape; encasing the component in a shell mold; curing the shell mold; placing the encased component in a furnace and melting the component; solidifying the component in the shell mold; and removing the shell mold from the solidified component.

The method of the preceding paragraph can optionally include, additionally and/or alternatively, any one or more of the following techniques, steps, features, and/or configurations:

The component is additively manufactured to have voids greater than 0 percent but less than approximately 1 percent by volume.

The component is additively manufactured to have up to 15 percent additional material by volume in the near finished shape compared to a desired finished configuration.

The component is a blade or vane and the up to 15 percent additional material by volume is located at a root or a tip of an airfoil of the component.

Encasing the component in a shell mold comprises encasing an entirety of the component in the shell mold such that an entire external surface of the component is covered by the shell mold.

Encasing the component in the shell mold comprises a process of: (a) dipping the entirety of the component in a slurry to form a layer of the shell mold on the entirety of the component; (b) drying the layer of the shell mold; and (c) repeating steps (a) and (b) until an acceptable shell mold thickness is formed to encase the entirety of the component.

The component is additively manufactured using at least one of selective laser sintering, selective laser melting, direct metal deposition, direct metal laser sintering, direct metal laser melting, and electron beam melting.

The component is additively manufactured to be of a metal selected from the group consisting of a nickel-based superalloy, cobalt-based superalloy, iron-based superalloy, and mixtures thereof.

A method to regenerate a component with internal passageways, the method comprising: additively manufacturing the component to have voids greater than 0 percent but less than approximately 15 percent by volume with an internal passageway in a near finished shape; filling the internal passageway with a slurry; curing the slurry to form a core; encasing the component in a shell mold; curing the shell mold; placing the encased component in a furnace and melting the component; solidifying the component in the shell mold; and removing the shell mold and core from the solidified component.

The method of the preceding paragraph can optionally include, additionally and/or alternatively, any one or more of the following techniques, steps, features, and/or configurations:

The core substantially conforms to a shape of the internal passageway of the component, and shell mold substantially conforms to a shape of the component.

The component is additively manufactured to have voids greater than 0 percent but less than approximately 1 percent by volume.

The component is additively manufactured to have up to 15 percent additional material by volume in the near finished shape compared to a desired finished configuration.

The component is a blade or vane and the up to 15 percent additional material by volume is located at a root or a tip of an airfoil of the component.

The component is additively manufactured using at least one of selective laser sintering, selective laser melting, direct metal deposition, direct metal laser sintering, direct metal laser melting, and electron beam melting.

The component is additively manufactured to be of a metal selected from the group consisting of a nickel based superalloy, cobalt based superalloy, iron based superalloy, and mixtures thereof.

The slurry is selected from the group consisting of silica, alumina, zircon, cobalt, mullite, and kaolin.

The shell mold is selected from the group consisting of silica, alumina, zircon, cobalt, mullite, kaolin, and mixtures thereof.

Encasing the component in a shell mold comprises encasing an entirety of the component in the shell mold such that an entire external surface of the component is covered by the shell mold.

Encasing the component in the shell mold comprises a process of: (a) dipping the entirety of the component in a slurry to form a layer of the shell mold on the entirety of the component; (b) drying the layer of the shell mold; and (c) repeating steps (a) and (b) until an acceptable shell mold thickness is formed to encase the entirety of the component.

An intermediate component with an internal passageway, the intermediate component comprising: a solid metallic additively manufactured component with an internal passageway in a near finished shape, wherein the component has voids greater than 0 percent but less than approximately 15 percent by volume and up to 15 percent additional material by volume in the near finished shape compared to a desired finished configuration; a ceramic core disposed within the internal passageway of the component; and an outer ceramic shell mold encasing an entirety of the component, such that an entire external surface of the component is covered by the outer ceramic shell mold.

Any relative terms or terms of degree used herein, such as "generally", "substantially", "approximately", and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, temporary alignment or shape variations induced by operational conditions, and the like.

Although the present invention has been described with reference to preferred embodiments, workers skilled in the art will recognize that changes may be made in form and detail without departing from the spirit and scope of the invention.

The invention claimed is:

1. An intermediate component with an internal passageway, the intermediate component comprising:
 a solid metallic additively manufactured component with an internal passageway in a near finished shape, wherein the component has voids greater than 0 percent but less than approximately 15 percent by volume and up to 15 percent additional material by volume in the near finished shape compared to a desired finished configuration;
 a ceramic core disposed within the internal passageway of the component; and
 an outer ceramic shell mold encasing an entirety of the component, such that an entire external surface of the component is covered by the outer ceramic shell mold.

2. The intermediate component of claim 1, wherein the component has voids greater than 0 percent but less than approximately 1 percent by volume.

3. The intermediate component of claim 1, wherein the component has voids greater than 0 percent but less than approximately 0.1 percent by volume.

4. The intermediate component of claim 1, wherein the component is a fuel nozzle.

5. The intermediate component of claim 1, wherein the component is selected from a group consisting of a turbine blade and a turbine vane.

6. The intermediate component of claim 5, wherein the component comprises:
 an airfoil; and
 a root adjacent the airfoil.

7. The intermediate component of claim 6, wherein the component further comprises:
 a platform adjacent the root and the airfoil.

8. The intermediate component of claim 7, wherein the airfoil, root, and platform are integrally formed.

9. The intermediate component of claim 6, wherein the additional material by volume is located at the root.

10. The intermediate component of claim 6, wherein the additional material by volume is located at a tip of the airfoil.

11. The intermediate component of claim 1, wherein the additional material by volume is located at a position on the component where the additional material can be machined.

12. The intermediate component of claim 1, wherein the ceramic core substantially conforms to a shape of the internal passageway.

13. The intermediate component of claim 1, wherein the component is a metal selected from the group consisting of a nickel-based superalloy, a cobalt-based superalloy, an iron-based superalloy, and mixtures thereof.

14. The intermediate component of claim 1, wherein the ceramic core is a material selected from the group consisting of silica, alumina, zircon, cobalt, mullite, and kaolin.

15. The intermediate component of claim 1, wherein the ceramic shell mold is a material selected from the group consisting of silica, alumina, zircon, cobalt, mullite, kaolin, and mixtures thereof.

16. The intermediate component of claim 1, wherein the ceramic shell mold has a thickness ranging from approximately 5 millimeters to approximately 32 millimeters.

17. The intermediate component of claim 1, wherein the voids comprise a subsurface defect.

18. The intermediate component of claim 17, wherein the subsurface defect is selected from a group consisting of pores and cracks.

19. The intermediate component of claim 1, wherein the component comprises a plurality of internal passageways.

* * * * *